United States Patent
Hasegawa (10) Patent No.: US 6,205,573 B1
(45) Date of Patent: Mar. 20, 2001

(54) DELAY ANALYSIS RESULT DISPLAY DEVICE

(75) Inventor: Takumi Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/176,426

(22) Filed: Oct. 21, 1998

(30) Foreign Application Priority Data

Oct. 22, 1997 (JP) .................................... 9-289327

(51) Int. Cl.⁷ .................................... G06F 17/50
(52) U.S. Cl. .................................... 716/11; 716/5
(58) Field of Search .................................... 716/1–21

(56) References Cited

U.S. PATENT DOCUMENTS

| | | | | |
|---|---|---|---|---|
| 4,924,430 | * | 5/1990 | Zasio et al. ................. | 716/6 |
| 4,970,664 | * | 11/1990 | Kaiser et al. ................. | 345/346 |
| 5,572,717 | * | 11/1996 | Pedersen ................. | 713/500 |
| 5,787,268 | * | 7/1998 | Sugiyama et al. ................. | 716/11 |
| 5,889,677 | * | 3/1999 | Yasuda et al. ................. | 716/6 |
| 5,896,301 | * | 4/1999 | Barrientos ................. | 716/8 |
| 5,903,472 | * | 5/1999 | Barrientos ................. | 716/10 |
| 5,949,690 | * | 9/1999 | Lawman ................. | 716/16 |
| 6,083,273 | * | 7/2000 | Takeuchi ................. | 716/6 |
| 6,117,183 | * | 9/2000 | Teranishi et al. ................. | 716/11 |

FOREIGN PATENT DOCUMENTS

| | | | |
|---|---|---|---|
| 64-82260 | 3/1989 | (JP) ................. | G06F/15/60 |
| 2-245879 | 10/1990 | (JP) ................. | G06F/15/62 |
| 4-92976 | 3/1992 | (JP) ................. | G06F/15/60 |
| 4-369079 | 12/1992 | (JP) ................. | G06F/15/60 |
| 5-108751 | 4/1993 | (JP) ................. | G06F/15/60 |
| 5-242194 | 9/1993 | (JP) ................. | G06F/15/60 |
| 6-266795 | 9/1994 | (JP) ................. | G06F/15/60 |
| 6-266803 | 9/1994 | (JP) ................. | G06F/15/60 |
| 6-310601 | 11/1994 | (JP) ................. | H01L/21/82 |
| 8-288395 | 11/1996 | (JP) ................. | H01L/21/82 |

OTHER PUBLICATIONS

Schupp et al. ("SPI: an open interface integrating highly interactive electronic CAD tools", Proceedings of the European Design Automation Conference, 1990, EDA, Mar. 12 1990, pp. 492–495).*

Narayananan et al. ("PEPPER—a timing driven early floorplanner", Proceedings of 1995 IEEE International Conference on Computer Design: VLSI in Computers and Processors, ICCD '95, Oct. 2, 1995, pp. 230–235).*

Hemani et al. ("Application of high–level synthesis in an industrial project", Proceedings of the Seventh International Conference on VLSI Design, 1994, Jan. 5, 1994, pp. 5–10).*

Gupta et al. ("Specification and analysis of timing constraints for embedded systems", IEEE Transactions on Computer–Aided Design of Integrated Circuits and Systems, vol. 16, No. 3, Mar. 1997, pp. 240–256), Mar. 1990.*

* cited by examiner

*Primary Examiner*—Matthew Smith
*Assistant Examiner*—Phallaka Kik
(74) *Attorney, Agent, or Firm*—Sughrue, Mion, Zinn, Macpeak & Seas, PLLC

(57) ABSTRACT

A delay analysis result of a designated path in a logic circuit is stored in a delay analysis result storage means 41, element and wire information of the overall logic circuit is stored in the circuit storage means 42, and information for designating a wire in a designated path to be the root of extension of analysis is stored in designator storing means 43. Display means 44 picks up from circuit storage means 42 wires and elements which are connected to the designated wire and are not contained in the designated path, and displays them together with the designated path which is an analysis target in delay analysis result storage means 41.

25 Claims, 7 Drawing Sheets

F I G. 4

○ : NODE  → : ARC

FIG. 5

NODE TABLE

| NUMBER | INPUT-DIRECTION-ARC | OUTPUT-DIRECTION-ARC | ADDITIVE DELAY TIME | PIN NAME |
|---|---|---|---|---|
| 1 | 0 | 1 | 1 | |
| 2 | 1 | 2 | 0 | |
| 3 | 2 | 3 | 0 | |
| 4 | 3 | 4 | 0 | |
| 5 | 4 | 5 | 0 | |
| 6 | 5 | 0 | 1 | (OMITTED) |
| 7 | 6 | 7 | 0 | |
| 8 | 7 | 8 | 0 | |
| 9 | 8 | 0 | 2 | |
| 10 | 9 | 10 | 0 | |
| 11 | 10 | 11 | 0 | |
| 12 | 11 | 0 | 3 | |

FIG. 6

ARC TABLE

| NUMBER | INPUT-DIRECTION-NODE | OUTPUT-DIRECTION-NODE | ARC HAVING THE SAME INPUT-DIRECTION-NODE | ARC HAVING THE SAME OUTPUT-DIRECTION-NODE | DELAY TIME | DELAY TIME OF ELEMENT | ELEMENT NAME | WIRE NAME |
|---|---|---|---|---|---|---|---|---|
| 1 | 1 | 2 | 0 | 0 | 1 | 1 | 21 | 31 |
| 2 | 2 | 3 | 0 | 0 | 1 | 0 | 22 | — |
| 3 | 3 | 4 | 6 | 0 | 2 | 0 | — | 32 |
| 4 | 4 | 5 | 0 | 0 | 2 | 0 | 23 | — |
| 5 | 5 | 6 | 0 | 0 | 1 | 1 | 24 | 33 |
| 6 | 3 | 7 | 9 | 0 | 1 | 0 | — | 32 |
| 7 | 7 | 8 | 0 | 0 | 0.5 | 0 | 25 | — |
| 8 | 8 | 9 | 0 | 0 | 0.5 | 0.5 | 27 | 34 |
| 9 | 3 | 10 | 0 | 0 | 1 | 0 | — | 32 |
| 10 | 10 | 11 | 0 | 0 | 0.3 | 0 | 26 | — |
| 11 | 11 | 12 | 0 | 0 | 0.3 | 0.5 | 28 | 35 |

FIG. 7

WHEN WIRE 32 IS DESIGNATED

| NUMBER | WIRE OR ELEMENT | LOCATION |
|---|---|---|
| 1 | WIRE | 32 |

DELAY ANALYSIS RESULT DISPLAY DEVICE

BACKGROUND OF THE INVENTION

1. Field of the Invention

The present invention relates to a delay analysis result display device and particularly, to a delay analysis result display device for a logic circuit.

2. Description of the Prior Art

Figure 11:
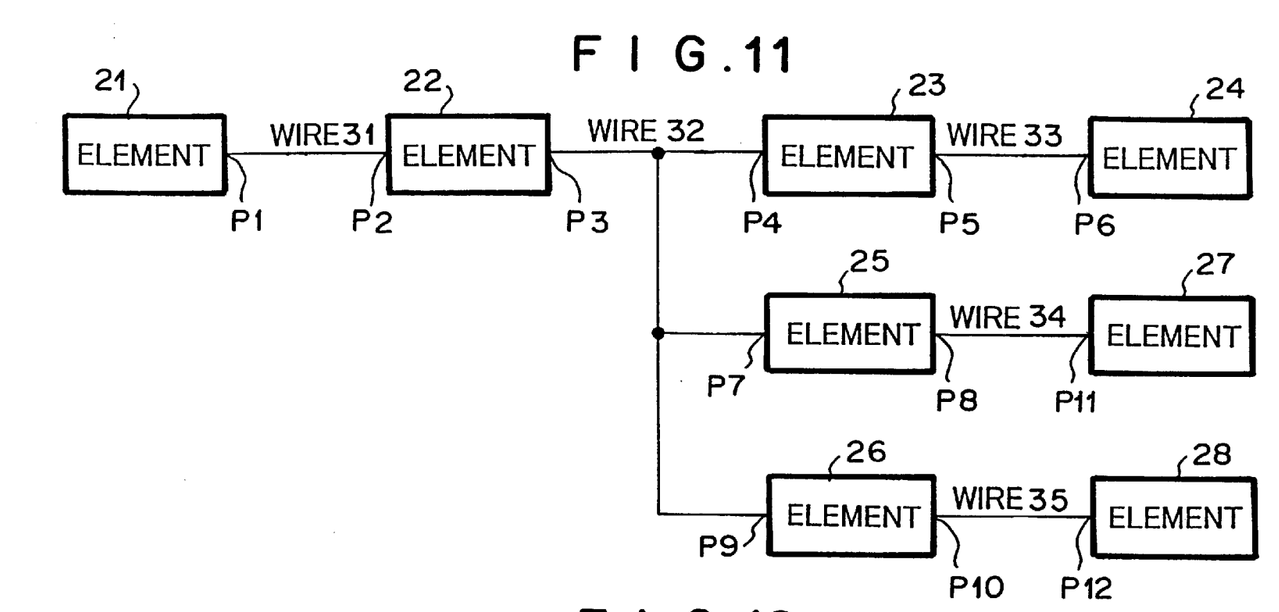
FIG. 11 is a circuit diagram showing a logic circuit.

FIG. 11 is a general circuit diagram of a logic circuit. This circuit includes elements 21 to 28, and wires 31 to 35 each of which is connected between the elements. Elements 21 to 28 are electrically connected to wires 31 to 35 through pins P1 to P12. Each of elements 21, 24, 27, 28 consists of a flip-flop. It is assumed that information on an inter-pin delay time of each of elements in the circuit, a inter-pin delay time of each of wire in the circuit, etc. are beforehand stored in a delay analysis result display device.

It is now assumed that an operator inputs to the delay result display device a command to display a delay analysis result of the path between flip-flops 21 and 24.

Figure 12:
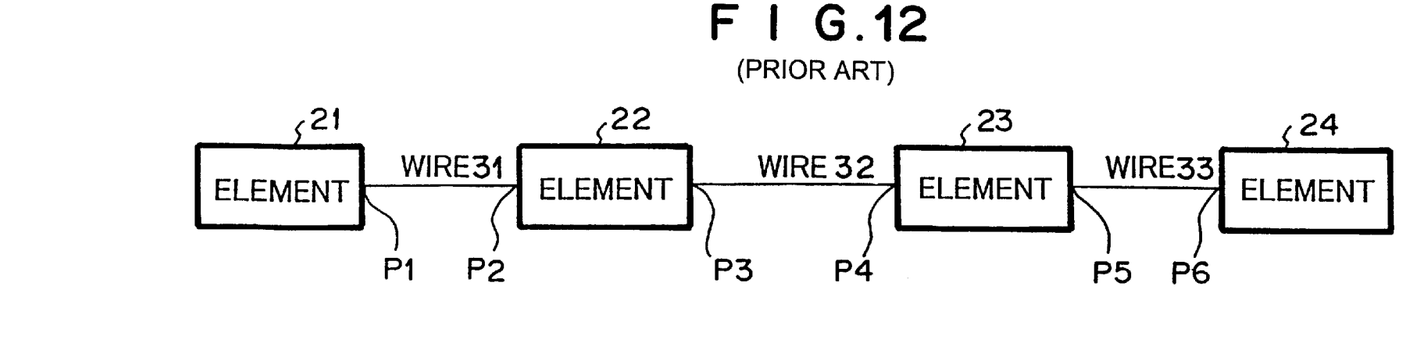
FIG. 12 is a diagram showing an example of a circuit diagram displayed on the screen of the conventional delay analysis result display device.

FIG. 12 shows an example of a circuit diagram which is displayed on a screen of the delay analysis result display device. In response to the command, the delay analysis result display device displays such a circuit as shown in FIG. 12, and also displays a delay analysis result of this path (not shown).

In FIG. 12, only elements 21 to 24 and wires 31 to 33 connected therebetween are illustrated. Further, at the same time, the delay analysis result only for the circuit shown in FIG. 12 is displayed. An example of this type delay analysis system is disclosed in JPA-2-245879. This publication discloses as a prior art an analysis system comprising a CAD master file, an FF check program, an FF check result file, an analysis program, and a list.

According to the analysis system, circuit elements and wiring conditions stored in the CAD master file are used for path ready check between FFs (flip-flops) by an FF check program, the path ready check result thus obtained is outputted to the FF check result file, the data thus outputted are analyzed by batch process using an analysis program and the analysis result is output as a list. Among the members of the system, the FF check result file corresponds to the delay analysis result, and the list corresponds to the display device.

However, the conventional delay analysis result display device displays only a path which is obtained from the delay analysis result. That is, only elements 21 to 24 and wires 31 to 33 which are connected between the respective elements are displayed as shows in FIG. 12. Therefore, even when the circuit correction is intended to be performed on the basis of the delay analysis result, it needs a large labor to perform the circuit correction because the situation of adjoining circuits is unknown.

That is, in order to examine the situation of the adjoining circuits, it is needed to examine the corresponding path or wire by making reference to a circuit diagram on a paper or on a screen of a circuit diagram display device or the like, whereby large time is needed for the circuit correction.

The system disclosed in JPA-2-245879 never teaches means for solving the above problem.

SUMMARY OF THE INVENTION

Therefore, an object of the present invention is to provide a delay analysis result display device which enables a user to recognize the situation of circuits adjoining to the path for which a delay analysis result is displayed.

According to the present invention, there is provided a delay analysis result display device which displays a delay time analysis result of each of electrical signals in a designated path in an electrical circuit, which comprises: delay time analysis result storage means for storing the delay time analysis result; circuit information storage means for storing circuit information containing the delay time of each of electrical signals of all paths in the electrical circuit; designator storage means for designating a wire between any elements in the designated path; and display means for displaying the delay time analysis result while adding into the designated path other wires which are not contained in the designated path, but contained in the electrical circuit and which are electrically connected to the designated wire, and displaying the delay time analysis result of each of electrical signals of the other wires.

According to the present invention, the display means displays the delay time analysis result of the designated path while adding another wire which is electrically connected to the designated wire and is not contained in the designated path.

DETAILED DESCRIPTION OF THE PREFERRED EMBODIMENT

A preferred embodiment according to the present invention will be explained hereunder with reference to the accompanying drawings.

Figure 1:
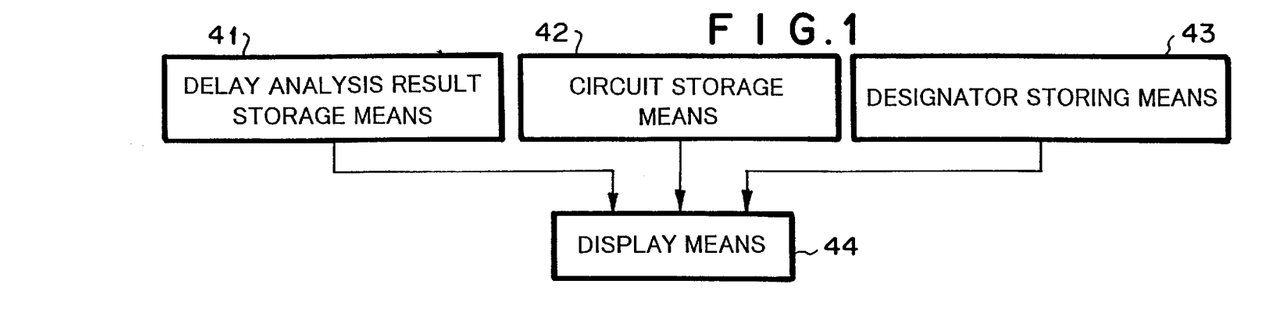
FIG. 1 is a diagram showing the best mode of embodiment of a delay analysis result display device according to the present invention.

FIG. 1 is a diagram showing the best mode of a delay analysis result display device according to the present invention.

The delay analysis result display device according to the present invention includes delay analysis result storage means 41 for storing a delay analysis result of a designated path of a logic circuit, circuit storage means 42 for storing information on elements and wires contained in the overall logic circuit, designator storing means 43 for storing information which designates a predetermined wire in a designated path, and display means 44 for displaying wire and element information in a fan-out direction of a wire designated by the designator storing means 43 in addition to the delay analysis result on the basis of the information stored in delay analysis result storage means 41, circuit storage means 42 and designator storing means 43.

It is assumed that information on elements and wires shown in FIG. 11 is stored in circuit storage means 42, and the delay analysis result of a designated path shown in FIG. 12 is stored in delay analysis result storage means 41.

Figure 2:
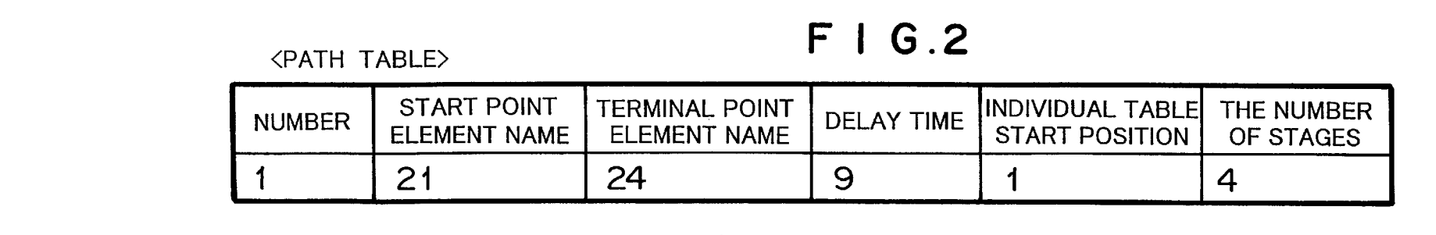
FIG. 2 is a diagram showing the structure of a path table stored in delay analysis result storage means.

First, delay analysis result storage means 41 will be explained. FIG. 2 is a diagram showing a path table stored in delay analysis result storage means 41, and FIG. 3 is a diagram showing an individual table stored in delay analysis result storage means 41.

Referring to FIGS. 2 and 12, recorded in the path table are a start point element name taking value "21", a terminal point element name taking value "24", a delay time along a path extending from element 21 to element 24, which is taking value "9", an individual table start position taking value "1", and the number of stages of a circuit "4" as explained later. Number taking value "1" in the leftmost column is a reference number.

It is apparent from this table that the number of elements contained in this path is 4 and the delay time along this path is "9".

Figure 3:
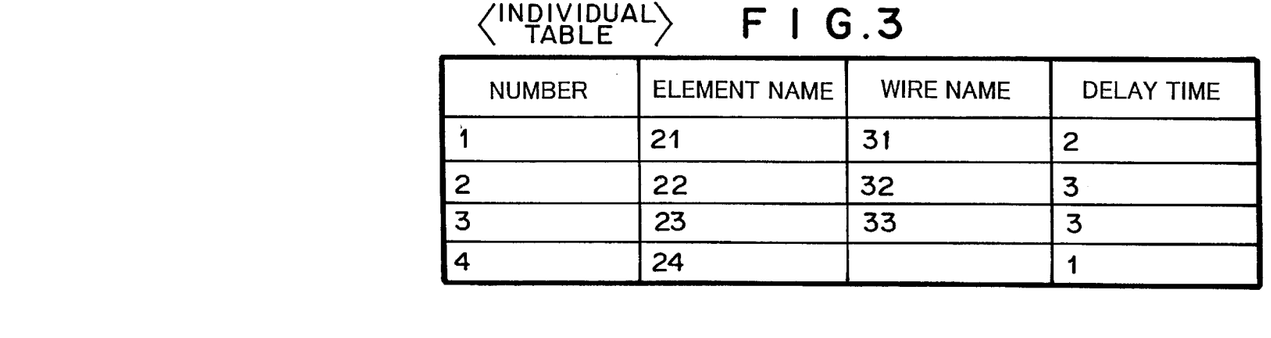
FIG. 3 is a diagram showing the structure of an individual table stored in the delay analysis result storage means.

Next, referring to FIGS. 3 and 12, recorded in the individual table are an element name taking value "21", a wire name taking value "31" and a delay time taking value "2" in a row numbered 1, an element name taking "22", a wire name taking value "32" and a delay time taking value "3" in a row numbered 2, an element name taking value "23", a wire name taking value "33" and a delay time taking value "3" in a row numbered 3, and an element name taking value "24" and a delay time taking value "1" in a row numbered 4. That is, the delay time of every stage is recorded in the individual table.

Next, the circuit storage means 42 will be explained.

Figure 4:
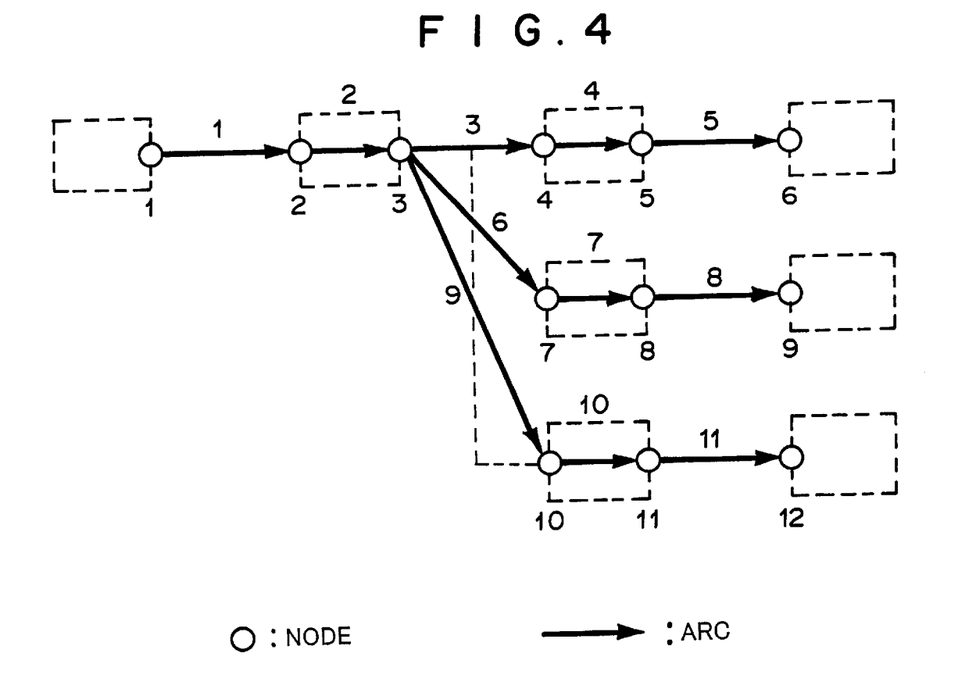
FIG. 4 is a diagram showing nodes and arcs stored in the delay analysis result storage means.
Figure 5:
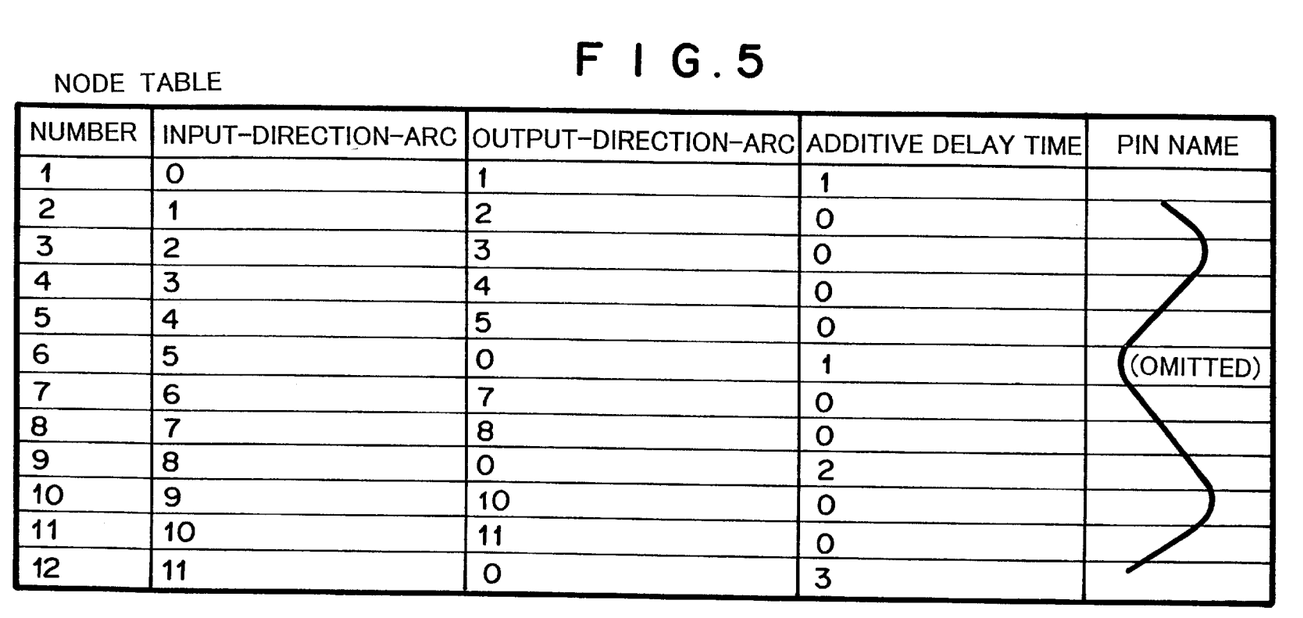
FIG. 5 is a diagram showing the structure of a node table stored in the delay analysis result storage means.
Figure 6:
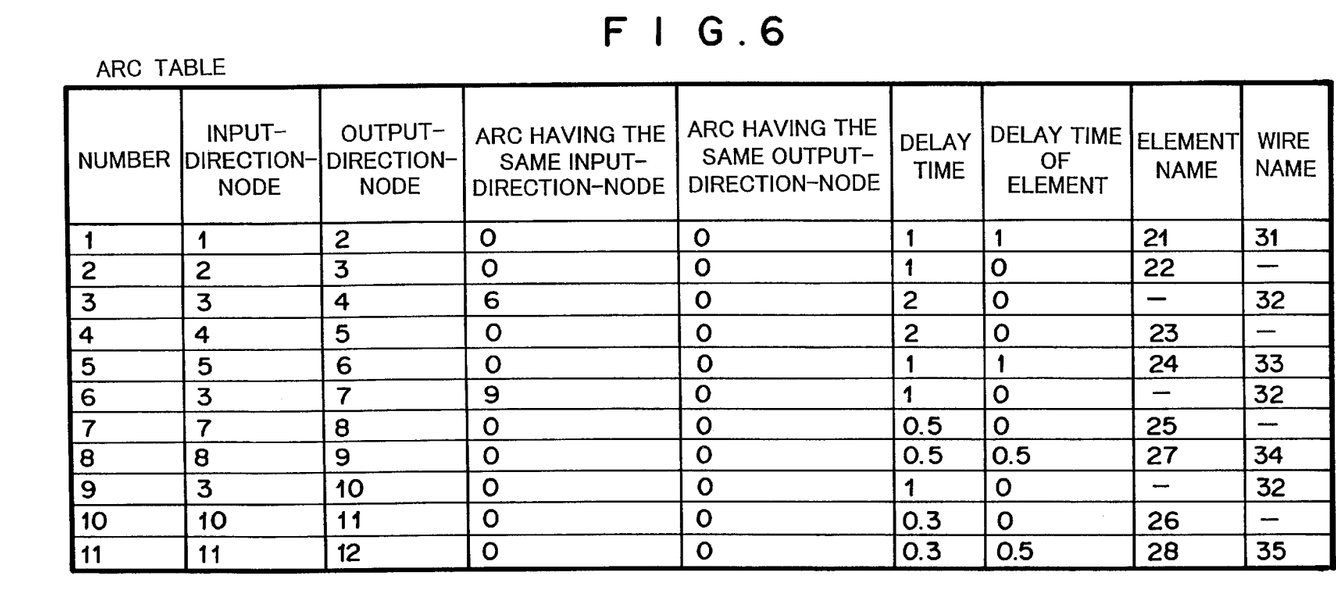
FIG. 6 is a diagram showing the structure of an arc table stored in the delay analysis result storage means.

FIG. 4 is a diagram showing nodes and arcs stored in circuit storage means 42, FIG. 5 is a diagram showing a node table stored in circuit storage means 42, and FIG. 6 is a diagram showing an arc table stored in circuit storage means 42.

The diagram of the nodes and the arcs shown in FIG. 4 is obtained by expressing the logic circuit of FIG. 11 with nodes and arcs. In FIG. 4, the nodes are expressed with circles and the arcs are expressed with arrows.

Nodes 1 to 12 correspond to pins (pins P1 to P12 of FIG. 11) through which the elements and the wires are electrically connected to one another. Arcs 1 to 11 correspond the elements and the wires (elements 21 to 28 and wires 31 to 35 of FIG. 11).

Circuit storage means 42 displays connection information with nodes 1 to 12 and arcs 1 to 11.

Referring to FIGS. 4, 5 and 11, recorded in the node table are such information that the input-direction-arc of the node 1 is "0", the output-direction-arc thereof is "1" and the additive delay time thereof is "1". This means that no arc exists at the input side of node 1, but arc 1 exists at the output side of node 1. That no arc exists at the input side of node 1 means that element 21 is electrically connected to the terminal portion of the path. The additive delay time means a delay time due to element 21.

Likewise, such information that the input-direction-arc of node 6 of the number 6 is "5", the output-direction-arc thereof is "0", and the additive delay time thereof is "1" is recorded.

This means that no arc exists at the output side of node 6 and arc 5 exists at the input side thereof. That no arc exists at the output side of node 6 means that element 24 is electrically connected to the terminal portion of the path. The additive delay time represents the delay time due to element 24.

Likewise, such information that the input-direction-arc of node 2 is "1", the output-direction-arc thereof is "2" and the additive delay time thereof is "0" is recorded. This means that the arcs 1, 2 exist at the input side and the output side of node 2, respectively. The additive delay time represents the delay time due to the element 22, which is zero.

"Pin name" on the node table is the name which is allocated to each of the pins P1 to P12, however, the description thereof is omitted because it is not related to the present invention. Further, information such as "pin capacity", "pin resistant value", etc. may be recorded on the node table.

Further, the same explanation may be made on the other nodes 3 to 5 and 7 to 12. Therefore, only the numerical values thereof are written for these nodes on the node table, and the explanation thereof is omitted.

In summary, the node table indicates the arcs existing at the input and output sides.

Next, referring to FIGS. 4, 6 and 11, recorded in the arc table is such information that the input-direction-node of arc 1 is "1", the output-direction-node thereof is "2", the arc of the same input-direction-node thereof is "0", the arc of the same output-direction-node is thereof "0", the delay time thereof is "1", the delay time of the element thereof is 21", the element name thereof is "21", and the wire name thereof is "31".

This means that nodes 1 and 2 exist at the input and output sides of arc 1, respectively, but no other arc having the same nodes exists, and further means that the delay time of wire 31 is "1" and the delay time of element 21 is "1".

Subsequently, recorded in a third row of the arc table are such information that the input-direction-node of arc 3 is "3", the output-direction-node thereof is "4", the arc having the same input-direction-node is "6", the arc having the same output-direction-node is "0", the delay time thereof is "2", the delay time of the element thereof is "0", no element name is given thereto, and the wire name thereof is "32".

This means that nodes 3 and 4 exist at the input and output sides of arc 3, respectively, and another arc 6 exists at the input side, and further means that the delay time of wire 32 is "2" and the delay time of the element is "0".

Subsequently, recorded in a sixth row of the arc table are such information that the input-direction-node of arc 6 is "3", the output-direction-node thereof is "7", the arc having the same input-direction-node is "9", the arc having the same output-direction-node is "0", the delay time thereof is "1", the delay time of the element thereof is "0", no element name is given thereto, and the wire name thereof is "32".

This means that nodes 3 and 7 exist at the input and output sides of arc 6, respectively, and another arc 9 exists at the input side, and further means that the delay time of wire 32 is "1" and the delay time of the element is "0".

Subsequently, recorded in a ninth row of the arc table is such information that the input-direction-node of arc 9 is "3", the output-direction-node is "10", the arc having the same input-direction-node is "0", the arc having the same output-direction-node is "0", the delay time thereof is "1", the delay time of the element thereof is "0", no element name is given thereto, and the wire name thereof is "32".

This means that nodes 3 and 10 exit at the input and output sides of arc 9, respectively, but no other arc exists, and further means that the delay time of wire 32 is "1" and the delay time of the element is "0".

Likewise, the same description may be made on the other numbers 2, 4, 5, 7, 8, 10, and 11. Therefore, only the numerical values thereof are written for these arcs on the arc table, and the explanation thereof is omitted.

Next, the designator storing means 43 will be explained.

Figure 7:
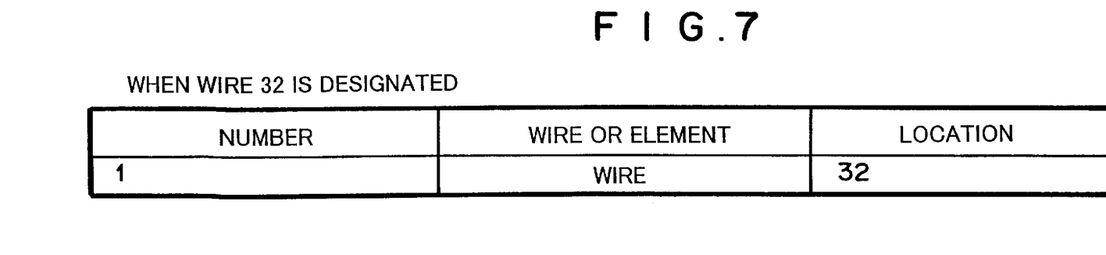
FIG. 7 is a diagram showing a table stored in designator storage means.

FIG. 7 is a diagram showing a table stored in the designator storing means 43.

Referring to FIGS. 7 and 12, information when wire 32 of FIG. 12 is designated is recorded in the table of FIG. 7. The number 1 is a reference numeral. Recorded in a column for a wire or element is information which identifies whether a target to be designated is a wire or element. In FIG. 7, "wire" is designated. A location of "wire" is recorded in a location column. In FIG. 7, wire 32 is designated.

Designating wire 32 out of designated paths extending from element 21 to element 24 means that the displaying of elements and wires which are outside the designated path and are electrically connected to wire 32 is requested.

Next, the operation of the delay analysis result display device will be explained.

As explained above, the information of the elements and the wires contained in the overall logic circuit is stored in circuit storage means 42, and the delay analysis result of the designated path of the logic circuit is stored in delay analysis result storage means 41. Designating information "wire 32" is stored in designator storing means 43.

Figure 8:
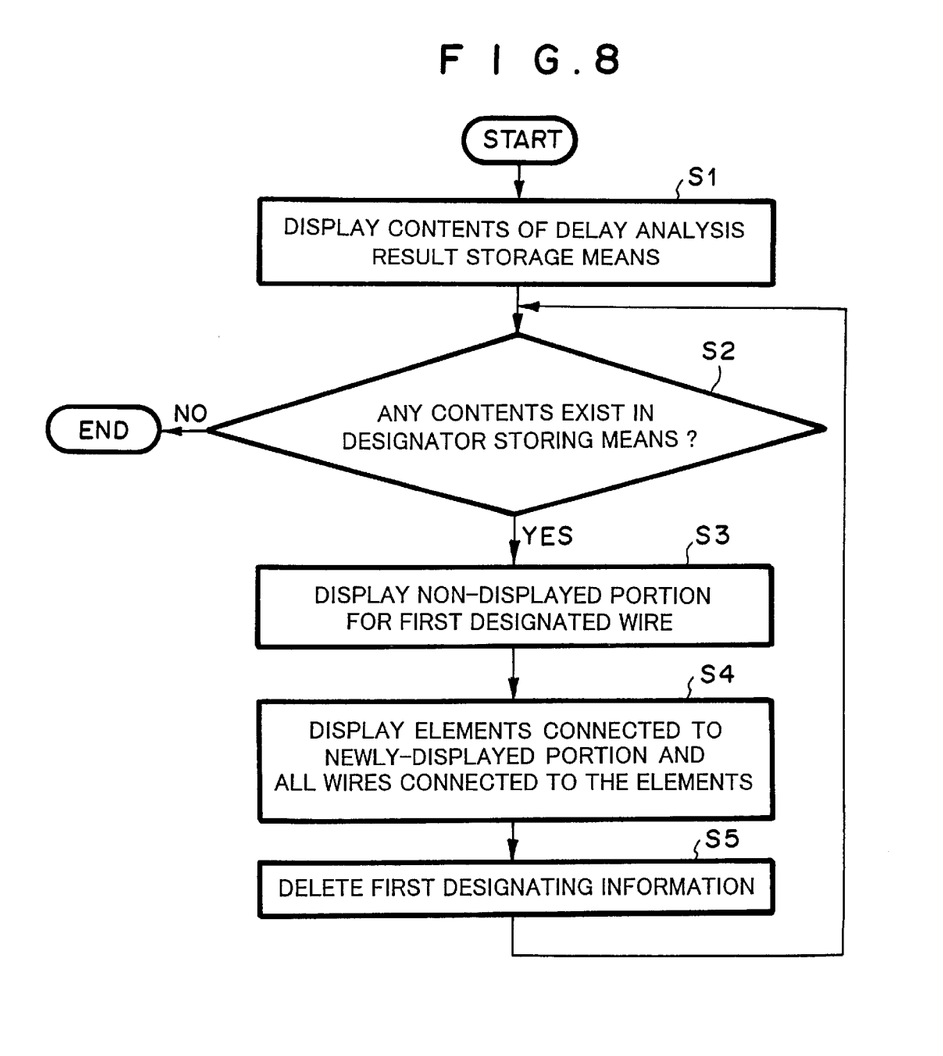
FIG. 8 is a flowchart showing the operation of display means.
Figure 9:
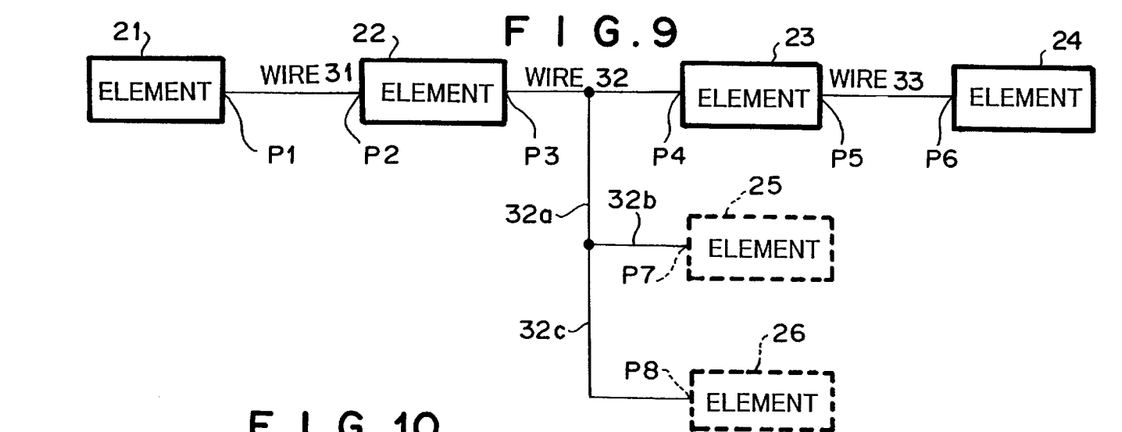
FIG. 9 is a diagram showing a frame displayed by the display means.
Figure 10:
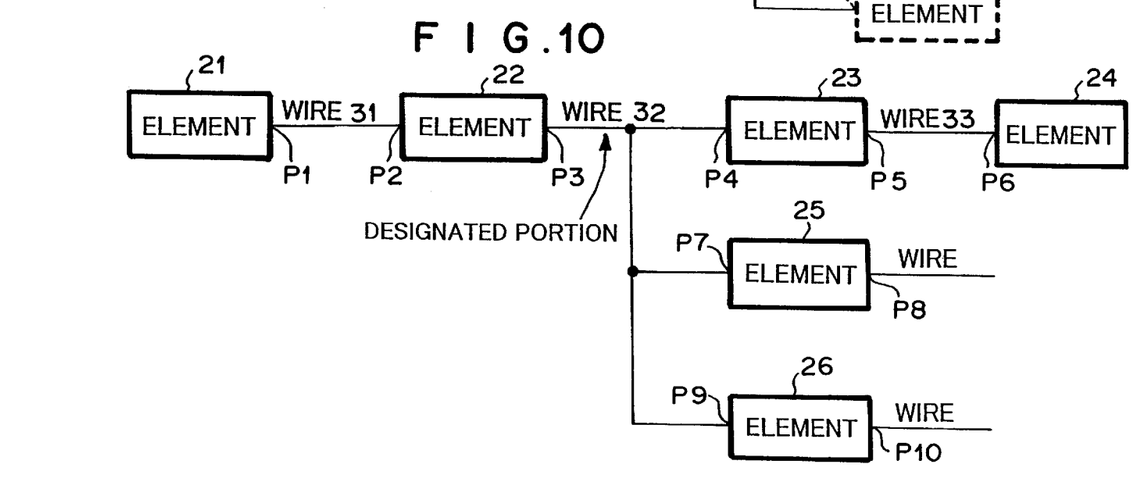
FIG. 10 is a diagram showing another frame displayed by the display means.

On the basis of the information stored in each means, display means 44 performs the following operation. FIG. 8 is a flowchart showing the operation of display means 44, and FIGS. 9 and 10 are diagrams showing a frame which is displayed by the display means.

First, display means 44 displays a delay analysis result of a designated path of a logic circuit stored in the delay analysis result storage means 41 (S1). The display frame is a circuit diagram shown in FIG. 12. The delay time data in the designated path are also separately displayed (illustration is omitted).

Subsequently, display means 44 checks whether the designating information is stored in designator storing means 43 (S2).

Since the designating information "wire 32" is stored in designator storing means 43 at present, display means 44 displays a non-displayed portion for the first designated wire "32" (S3). The display frame is a circuit diagram shown in FIG. 9.

According to FIG. 9, wires 32a and 32b which are electrically connected to element 25 and wire 32c which is electrically connected to element 26 are portions which are to be further added to the circuit diagram of FIG. 12. The elements 25 and 26 are not displayed at the present time, however, they are illustrated by broken lines for convenience's sake. The delay time data in these designated paths are also separately displayed (illustration is omitted).

Subsequently, display means 44 displays elements which are electrically connected to the newly-displayed portions (wires 32a to 32c), and all wires which are electrically connected to the elements (S4). The display frame thereof is a circuit diagram shown in FIG. 10.

According to FIG. 10, portions to be further added to the circuit diagram of FIG. 9 are elements 25 and 26, and wires 34 and 35 which are electrically connected to elements 25, 26, respectively. The delay time data in the designated paths are also separately displayed (illustration is omitted).

Subsequently, display means 44 deletes the first designating information (the designation of "wire 32") stored in designator storing means 43 (S5).

Subsequently, display means 44 checks whether the designating information is stored in designator storing means 43 again (S2). However, since no other designating information is stored in designator storing means 43, display means 44 finishes its operation.

Designator storing means 43 may be constructed by a pointing device such as a mouse or the like. That is, if display means 44 is constructed so that a wire existing at a prescribed position in a circuit diagram displayed on the display frame of display means 44 is designated by the pointing device to select the wire, the designation of the wire can be performed.

According to the present invention, a delay analysis result display device which analyzes a delay time of an electrical signal of a designated path in an electrical circuit, comprises delay time analysis result storage means for storing the delay time analysis result of the electrical signal of the designated path, circuit information storage means for storing circuit information containing the delay time of electrical signals of all paths in the electrical circuit, designation storage means for designating a wire between predetermined elements in the designated path, and display means for displaying the delay time analysis result while adding into the designated path another wire which is not contained in the designated path, but contained in the electrical circuit and which is electrically connected to the designated wire, and displaying the delay time analysis result thereof. Therefore, the status of circuits adjoining to the path for which the delay analysis result is displayed can be easily grasped by a user.

What is claimed is:

1. A delay analysis result display device which displays a delay time analysis result of each of electrical signals in a designated path in an electrical circuit, which comprises:

a delay time analysis result storage device that stores said delay time analysis result;

a circuit information storage device that stores circuit information containing the delay time of each of electrical signals of all paths in said electrical circuit;

a designator storage device that designates a wire between any elements in said designated path; and a display device that displays said delay time analysis result while adding into said designated path other wires which are not contained in said designated path, but contained in said electrical circuit and which are electrically coupled to said designated wire, and displays the delay time analysis result of each of electrical signals of said other wires.

2. The delay analysis result display device as set forth in claim 1, wherein said display device displays said delay time analysis result while adding other elements and further wires which are electrically coupled to said other wires.

3. The delay analysis result display device as set forth in claim 1, wherein said designated path is a path which extends from one flip-flop to another flip-flop through wires and elements between said two flip-flops.

4. The delay analysis result display device as set forth in claim 1, wherein said delay time analysis result of said each of electrical signals in said designated path contains at least the name of each element contained in said designated path, the delay time of said each element, the name of each wire contained in said designated path and the delay time of said each wire.

5. The delay analysis result display device as set forth in claim 1, wherein said circuit information containing the delay time of each of the electrical signals of all the paths in said electrical circuit contains at least the name of each of elements contained in all the paths, the delay time of each of said elements contained in all the paths, the name of each of wires contained in all the paths, and the delay time of each of said wires contained in all the paths.

6. The delay analysis result display device as set forth in claim 1, wherein said display device at least displays elements in said designated path and wires between said elements in said designated path, and said designator storage device stores any wire selected from the wires displayed on said display device.

7. The delay analysis result display device as set forth in claim 1, wherein said electrical circuit is a logic circuit.

8. A system for displaying a delay analysis result, comprising:
a first memory device that stores information for a circuit;
a second memory device that stores results of said delay analysis for said circuit;
a third memory device that stores information for a designated path of said circuit; and
a display device that generates a display in accordance with a delay analysis result for said designated path and adds display information to said display for a non-designated path, wherein said non-designated path is coupled to said designated path.

9. The system of claim 8, wherein said circuit information comprises information on elements and wires for said circuit.

10. The system of claim 9, wherein said circuit comprises an integrated circuit.

11. The system of claim 9, said elements and wires respectively comprising nodes and arcs.

12. The system of claim 8, wherein said second memory device comprises a first table that stores overall path information and a second table that stores individual path information.

13. The system of claim 8, wherein said delay analysis results comprise delay times for a portion of said designated path.

14. The system of claim 8, wherein said designated path information comprises a reference indicator, a designation of a target as one of a wire and an element, and a location indicator for said target.

15. The system of claim 8, further comprising a pointing device that obtains said designated path information.

16. The system of claim 8, wherein said display device comprises a visual display.

17. The system of claim 8, wherein said circuit is a logic circuit.

18. The system of claim 8, wherein said designated path comprises a path extending from a first flip-flop to a second logic flip-flop via wires and elements coupled between said first flip-flop and said second logic flip-flop.

19. A method for displaying results of a delay analysis, comprising:
receiving and storing electrical circuit data stored in a memory device;
designating a path in said electrical circuit and storing designation information in said memory device;
displaying a result for said designated path in accordance with said delay analysis and said designation information; and
displaying a non-displayed portion for other wires not contained in said designated path, wherein other wires are displayed with said displayed result for said designated path.

20. The method of claim 19, further comprising terminating said method when said designation information is not present in said memory device.

21. The method of claim 20, said displaying said non-displayed portion step comprising the step of displaying a previously non-displayed portion for a first wire not contained in said designated path, elements coupled to said previously non-displayed portion, and wires coupled to said elements.

22. The method of claim 21, further comprising deleting said designation information from said memory device.

23. The method of claim 19, further comprising displaying delay time data for said designated path.

24. The method of claim 19, further comprising differentiating said designated path and said other wires by a first display scheme and a second display scheme.

25. The method of claim 19, wherein said display steps comprise graphically representing said designated path and said other wires in a video device.

* * * * *